United States Patent
Afazali-Ardakani et al.

(10) Patent No.: US 7,727,505 B2
(45) Date of Patent: *Jun. 1, 2010

(54) METHODS FOR SEPARATING CARBON NANOTUBES BY ENHANCING THE DENSITY DIFFERENTIAL

(75) Inventors: Ali Afazali-Ardakani, Ossining, NY (US); James B. Hannon, Mahopac, NY (US); Cherie R. Kagan, Bala-Cynwyd, PA (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/124,278

(22) Filed: May 21, 2008

(65) Prior Publication Data

US 2009/0291041 A1 Nov. 26, 2009

(51) Int. Cl.
*C01B 31/02* (2006.01)
(52) U.S. Cl. .................. 423/460; 209/274; 210/638; 210/639; 210/787; 423/461; 977/748; 977/751; 977/845; 977/847
(58) Field of Classification Search .............. 209/1, 209/155, 208, 659, 724, 725, 18, 44.1, 606; 210/634, 638, 639, 702, 729, 749, 787, 789, 210/806; 423/447.1, 447.2, 460, 461, 447.3; 977/748, 750, 751, 842, 845, 847
See application file for complete search history.

(56) References Cited

U.S. PATENT DOCUMENTS

| | | | |
|---|---|---|---|
| 6,841,139 B2 | 1/2005 | Margrave et al. | |
| 7,074,310 B2* | 7/2006 | Smalley et al. | 204/450 |
| 7,514,063 B1* | 4/2009 | Tulevski et al. | 423/460 |
| 2004/0040834 A1* | 3/2004 | Smalley et al. | 204/164 |
| 2004/0232073 A1* | 11/2004 | Papadimitrakopoulos | 210/634 |
| 2006/0054555 A1 | 3/2006 | Sun | |
| 2006/0062718 A1 | 3/2006 | Bahr et al. | |
| 2006/0105513 A1* | 5/2006 | Afzali-Ardakani et al. | 438/197 |
| 2006/0251568 A1 | 11/2006 | Fahlman | |
| 2007/0116632 A1* | 5/2007 | Harutyunyan | 423/447.3 |
| 2007/0125707 A1* | 6/2007 | Komatsu et al. | 210/634 |
| 2007/0148962 A1 | 6/2007 | Kauppinen et al. | |
| 2007/0258880 A1* | 11/2007 | Murakoshi | 423/447.1 |
| 2007/0269364 A1 | 11/2007 | Dieckmannet et al. | |
| 2007/0280876 A1* | 12/2007 | Tour et al. | 423/460 |
| 2008/0063587 A1* | 3/2008 | Strano et al. | 423/447.1 |
| 2008/0260616 A1* | 10/2008 | Tour et al. | 423/447.1 |
| 2008/0290007 A1* | 11/2008 | Fagan et al. | 209/659 |
| 2009/0075808 A1* | 3/2009 | Morikawa et al. | 501/95.1 |

OTHER PUBLICATIONS

Full Text PDF of Publication: "Multihydroxy Polymer-Functionalized Carbon Nanotubes: Synthesis, Derivatization and Metal Loading", Chao Gao et al., Journal: Macromolecules 2005, 38, pp. 8634-8648, Publication Date (Web): Sep. 17, 2005, Downloaded from the Internet on Dec. 12, 2009.*
Abstract of Publication: "Multihydroxy Polymer-Functionalized Carbon Nanotubes: Synthesis, Derivatization and Metal Loading", Chao Gao et al., Journal: Macromolecules 2005, 38, Publication Date (Web): Sep. 17, 2005, Downloaded from the Internet on Dec. 12, 2009.*
Christian Klinke, James B. Hannon, Ali Afzali, and Phaedon Avouris, Field-Effect Transistors Assembled from Functionalized Carbon Nanotubes, Nano Letters, 2006, 906-910, vol. 6, No. 5, American Chemical Society, Yorktown Heights, New York.
George S. Tulevski, James B. Hannon, Ali Afazali, Zhihong Chen, Phaedon Avouris, and Cherie R. Kagan, Chemically Assisted Directed Assembly of Carbon Nanotubes for the Fabrication of Large-Scale Device Arrays, JACS Articles, Sep. 7, 2007, 11964-11968, American Chemical Society, Yorktown Heights, New York.
R.M. Tromp, et al, "Novel Strategy for Diameter-Selective Separation and Functionalization of Single-Wall Carbon Nanotubes", Nano Letters, 2008, 469-472, vol. 8, No. 2, American Chemical Society, Yorktown Heights, NY.

* cited by examiner

*Primary Examiner*—Joseph W Drodge
(74) *Attorney, Agent, or Firm*—Cantor Colburn LLP; Vazken Alexanian

(57) ABSTRACT

A method for separating carbon nanotubes comprises: providing a mixture of carbon nanotubes; introducing an organic molecule having an end group capable of being chelated by a metal ion to the mixture of carbon nanotubes to covalently bond the organic molecule to at least one of the mixture of carbon nanotubes; and introducing a metal salt to the mixture of carbon nanotubes to chelate the end group of the organic molecule with the metal ion of the metal salt; and centrifuging the mixture of carbon nanotubes to cause the separation of the carbon nanotubes based on a density differential of the carbon nanotubes.

15 Claims, No Drawings

METHODS FOR SEPARATING CARBON NANOTUBES BY ENHANCING THE DENSITY DIFFERENTIAL

BACKGROUND OF THE INVENTION

1. Field of the Invention

This invention relates to carbon nanotubes, and particularly to methods for separating carbon nanotubes by enhancing the density differentials of the nanotubes.

2. Description of Background

One-dimensional nanostructures such as nanowires and carbon nanotubes (CNTs) exhibit excellent electrical properties and thus serve as attractive materials for use in electronic devices, including field effect transistors (FETs), memory elements, and sensors. The electronic properties of carbon nanotubes, however, depend highly on diameter and chirality, which controls whether a carbon nanotubes is metallic or semiconductive. For example, the band gap of semiconductive carbon nanotubes scales approximately with the inverse of its diameter. Thus, to produce CNT devices with select electrical characteristics, it is desirable to be able to tightly control the diameter distribution of the carbon nanotubes present in such devices.

Current methods employed to synthesize carbon nanotubes yield a complex mixture of both metallic and semiconductive carbon nanotubes. Unfortunately, efforts to separate carbon nanotubes by diameter and chirality have met with mixed success. For example, nanotubes of different diameters can be separated by functionalizing the nanotubes with surfactants such as deoxyribonucleic acid (DNA) strands, suspending the functionlized nanotubes in an aqueous solution, and then subjecting the functionalized nanotubes to high-speed centrifugation. Consequently, the nanotubes become separated based on the intrinsic density gradient created when the nanotubes are suspended in an aqueous solution followed by centrifugation. However, the difference in mass, and therefore difference in density, among the nanotubes is small, making this separation difficult.

SUMMARY OF THE INVENTION

The shortcomings of the prior art are overcome and additional advantages are provided through the provision of a method for separating carbon nanotubes by chelating metals ions to functionlized nanotubes to enhance the density differentials of those nanotubes.

In an embodiment, a method for separating carbon nanotubes comprises: providing a mixture of carbon nanotubes; introducing an organic molecule having an end group capable of being chelated by a metal ion to the mixture of carbon nanotubes to covalently bond the organic molecule to at least one of the mixture of carbon nanotubes; and introducing a metal salt to the mixture of carbon nanotubes to chelate the end group of the organic molecule with the metal ion of the metal salt; and centrifuging the mixture of carbon nanotubes to cause the separation of the carbon nanotubes based on a density differential of the carbon nanotubes.

Additional features and advantages are realized through the techniques of the present invention. Other embodiments and aspects of the invention are described in detail herein and are considered a part of the claimed invention. For a better understanding of the invention with advantages and features, refer to the description.

DETAILED DESCRIPTION OF THE INVENTION

A method for separating carbon nanotubes of different diameters and/or of different types, i.e., metallic versus semiconductive, is disclosed here. In an exemplary embodiment, this method includes obtaining a mixture of carbon nanotubes, which may have been previously synthesized, and dissolving the mixture of carbon nanotubes in an aqueous solution comprising a surfactant, e.g., sodium dodecyl sulfate. Next, an organic molecule or ligand having an end group capable of being chelated by a metal ion can be introduced to the mixture of carbon nanotubes to covalently bond the organic ligand to a surface of at least one of the carbon nanotubes. The end group of the organic ligand is desirably a compound that imparts water solubility to the aromatic molecule. A metal salt can then be introduced to the mixture of carbon nanotubes to chelate the end group of the organic ligand with the metal ion of the metal salt. The metal salt employed for this chelation can be any metal salt capable of producing a metal ion in aqueous solution that provides a density differential to the mixture of carbon nanotubes. Thereafter, the mixture of carbon nanotubes in the aqueous solution can be centrifuged to cause the separation of the carbon nanotubes based on a density gradient of the carbon nanotubes. The centrifuging can be performed at a high speed of about 5,000 g (relative centrifugal force) to about 20,000 g.

Attaching metal ions to ligands formed on the surfaces of carbon nanotubes in the manner described above amplifies the difference in density between nanotubes of different diameters and thus creates a larger density differential to allow for better resolution in the separation of the nanotubes. As a result, different fractions of the carbon nanotubes can be collected based on where they settle in the centrifuge. By way of example, carbon nanotubes having a diameter of about 0.5 nanometer (nm) to about 3.0 nm settle to the bottom of the centrifuge and thus can be easily separated from nanotubes having smaller diameters that settle above the bottom of the centrifuge.

In one embodiment, the mixture of carbon nanotubes comprises metallic carbon nanotubes and semiconductive carbon nanotubes, particularly single-walled carbon nanotubes (SWCNTs). In this case, the organic ligand has a greater affinity for the metallic nanotubes than the semiconductive nanotubes, e.g., silicon-based nanotubes. That is, they bond more quickly with metallic nanotubes than with semiconductive nanotubes. Accordingly, the metal ions can be strategically placed only on the metallic nanotubes as opposed to the semiconductive nanotubes to increase the density of those nanotubes such that they settle below the semiconductive nanotubes as a result of being centrifuged. Furthermore, the larger diameter metallic nanotubes can settle below the smaller diameter metallic nanotubes. If the semiconductive nanotubes are also functionalized, the larger diameter semiconductive nanotubes can settle below the smaller diameter semiconductive nanotubes. Accordingly, the nanotubes can be separated based on both their differences in type and in size.

The amount of carbon nanotubes present in the aqueous solution described above can be about 0.01 to about 1.0 weight %/total volume (% w/v) of the solution, more specifically about 0.1 to about 0.5% w/v. Further, the amount of the surfactant present in the aqueous solution can be about 0.1 to about 5% w/v, more specifically about 1.0 to about 2.0% w/v.

As indicated above, the carbon nanotubes can be functionalized with an organic ligand having an end group that can be chelated with a metal ion. The organic ligand can be, for example, an aromatic compound functionlized with a suitable end group. Examples of suitable end groups include but are not limited to hydroxamic acid, carboxylic acid, phosphonic acid, dipyridine, terpyridine, phthalocyanine, or a combination comprising at least one of the foregoing end groups. A specific example of the aromatic compound is an aryldiazonium salt, which has a hydroxamic acid tail group. The amount of organic ligands combined with the carbon nanotubes is desirably a stoichiometric amount relative to the moles of carbon present in the original mixture. In one embodiment, each carbon atom at the surface of each carbon nanotube in the original mixture that is capable of being functionalized can be covalently bonded with an organic ligand (i.e., 1 ligand per each carbon atom on the nanotube). In a more preferred embodiment, each nanotube includes 1 ligand per 10 carbon atoms.

Examples of suitable metals for use in the metal salt include but are not limited to ruthenium, iron, copper, manganese, molybdenum, zinc, gold, silver, and a combination comprising at least of the foregoing. In a particular embodiment, the amount of metal salt combined with the functionalized carbon nanotubes is an amount effective to chelate a metal ion to each ligand attached to the surfaces of the nanotubes.

A specific example of a carbon nanotube being covalently bonded to an aryldiazonium salt functionalized with a hydroxamic acid end group and then being chelated with a metal ion ($M^+$) through the addition of a metal salt (i.e., $MX_N$) is provided below, where X is an anion and N is 1-6.

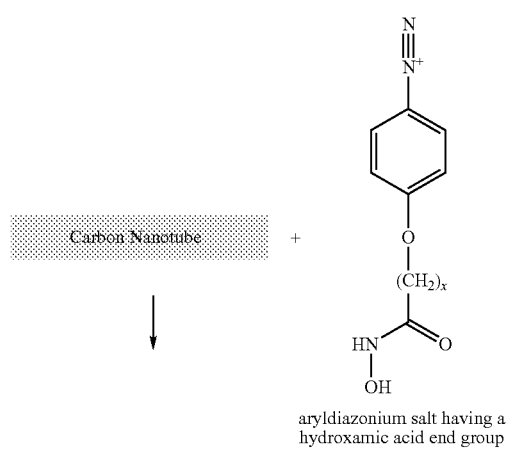

aryldiazonium salt having a hydroxamic acid end group

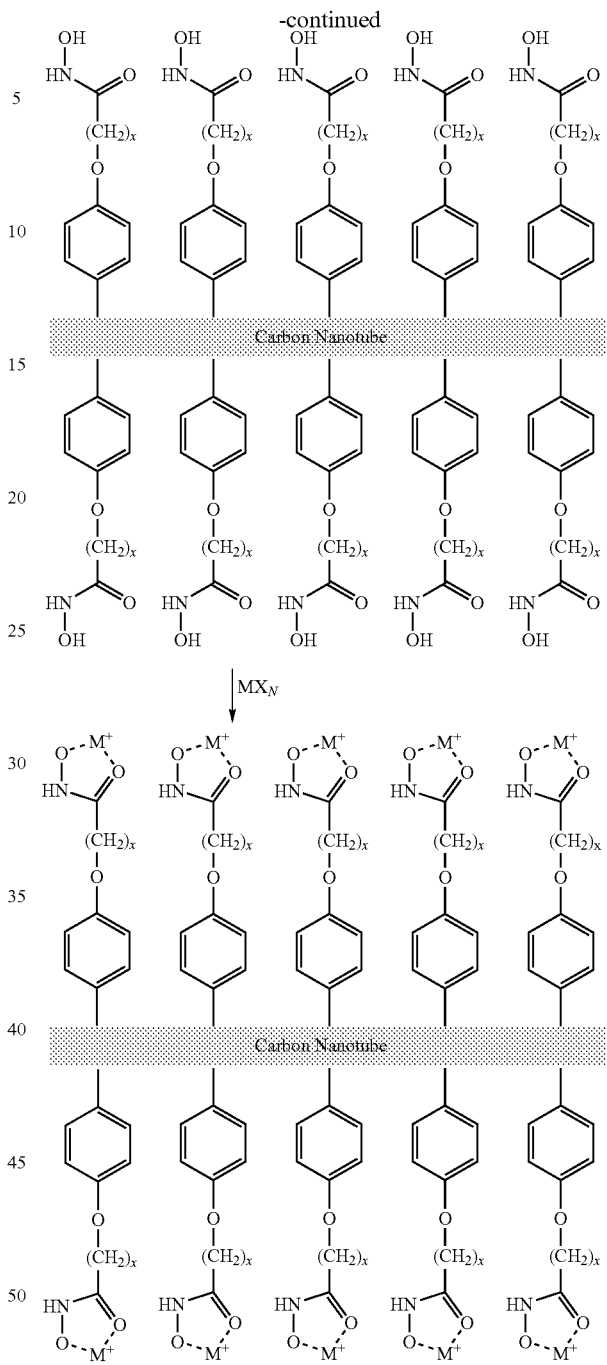

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for separating carbon nanotubes, comprising, in sequence:
    providing a mixture of carbon nanotubes;
    introducing an aryldiazonium salt having an end group capable of being chelated by a metal ion to the mixture of carbon nanotubes to covalently bond the aryldiazonium salt to a surface of at least one of the carbon nanotubes wherein the end group capable of being chelated is selected from the group consisting of hydroxamic acid, phosphonic acid, dipyridine, terpyridine, phthalocyanine, and mixtures thereof;
    introducing a metal salt to the mixture of carbon nanotubes to chelate the end group of the aryldiazonium salt with the metal ion of the metal salt; and
    centrifuging the mixture of carbon nanotubes to cause the separation of the carbon nanotubes based on a density differential of the carbon nanotubes.

2. The method of claim 1, wherein the metal ion comprises ruthenium, iron, copper, manganese, molybdenum, zinc, gold, silver, or a combination comprising at least of the foregoing.

3. The method of claim 1, further comprising dissolving the mixture of carbon nanotubes in an aqueous solution comprising a surfactant prior to said introducing the aromatic molecule.

4. The method of claim 3, wherein the surfactant comprises sodium dodecyl sulfate.

5. The method of claim 3, wherein the carbon nanotubes are present in the aqueous solution in an amount of about 0.01 to about 1.0% w/v.

6. The method of claim 3, wherein the amount of the surfactant present in the aqueous solution can be about 0.1 to about 5% w/v.

7. The method of claim 1, wherein the mixture of carbon nanotubes comprises a metallic carbon nanotube and a semiconductive carbon nanotube, and wherein the organic molecule has a greater affinity for the metallic carbon nanotube than the semiconductive carbon nanotube.

8. The method of claim 7, wherein the aryldiazonium salt is configured to have a greater affinity for single-walled metallic carbon nanotubes present in the mixture of carbon nanotubes.

9. The method of claim 1, wherein said centrifuging is performed at a speed of about 5,000 g to about 20,000 g.

10. The method of claim 1, further comprising collecting different fractions of the carbon nanotubes based on where they settle in the centrifuge.

11. The method of claim 1, wherein said centrifuging causes nanotubes of different diameters to separate.

12. The method of claim 1, wherein the carbon nanotubes having a diameter of about 0.5 nanometers to about 3.0 nanometers settle to the bottom of the centrifuge.

13. The method of claim 1, wherein a stoichiometric amount of aryldiazonium salt is introduced to the mixture of carbon nanotubes.

14. The method of claim 1, wherein the amount of metal salt combined with the functionalized carbon nanotubes is an amount effective to chelate the metal ion to the aryldiazonium salt on the surface of the at least one of the mixture of carbon nanotubes.

15. The method of claim 1, wherein a ratio of metal ions bonded to carbon atoms on each carbon nanotube is about 1:10.

* * * * *